United States Patent
Somura

(10) Patent No.: US 6,869,311 B2
(45) Date of Patent: Mar. 22, 2005

(54) RECEPTACLE

(75) Inventor: Atsushi Somura, Tondabayashi (JP)

(73) Assignee: Sharp Kabushiki Kaisha, Osaka (JP)

( * ) Notice: Subject to any disclaimer, the term of this patent is extended or adjusted under 35 U.S.C. 154(b) by 9 days.

(21) Appl. No.: 10/623,595

(22) Filed: Jul. 22, 2003

(65) Prior Publication Data

US 2004/0127096 A1 Jul. 1, 2004

(30) Foreign Application Priority Data

Aug. 9, 2002 (JP) ........................................ 2002-233740

(51) Int. Cl.[7] .............................................. H01R 13/73
(52) U.S. Cl. ....................................... 439/566; 439/571
(58) Field of Search ................................ 439/566, 607, 439/609, 352, 357, 610, 620, 571–573, 567, 901, 905–906, 638, 569–570

(56) References Cited

U.S. PATENT DOCUMENTS

| | | | | |
|---|---|---|---|---|
| 5,782,646 A | * | 7/1998 | Broadfield et al. | 439/346 |
| 5,863,210 A | * | 1/1999 | Reisinger | 439/41 |
| 6,450,835 B1 | * | 9/2002 | Lee | 439/607 |
| 6,478,617 B2 | * | 11/2002 | Fan | 439/570 |
| 6,508,670 B1 | * | 1/2003 | Hwang | 439/607 |
| 6,524,134 B2 | * | 2/2003 | Flickinger et al. | 439/607 |
| 6,746,282 B2 | * | 6/2004 | Meister | 439/638 |

FOREIGN PATENT DOCUMENTS

| | | |
|---|---|---|
| JP | 11-167966 | 6/1999 |
| JP | 2000-056186 | 2/2000 |

* cited by examiner

Primary Examiner—Gary Paumen
Assistant Examiner—Edwin A. Leon
(74) Attorney, Agent, or Firm—Nixon & Vanderhye, P.C.

(57) ABSTRACT

There is provided a receptacle, which comprises: a housing placed on a printed circuit board and having an insertion hole for receiving an optical signal transmission plug; a photoelectric converter housed in the housing for transferring and receiving an optical signal to/from the received optical signal transmission plug; and an elongate metal member covering the housing for fixing the housing onto the printed circuit board; the housing having a positioning recess formed in a peripheral surface portion thereof not opposed to the printed circuit board as having a shape complementary to that of the elongate member, and a flange overhanging the positioning recess; wherein the elongate member is fixedly fitted in the positioning recess in engagement with the flange; wherein the elongate member has projections respectively projecting from opposed portions thereof with the housing held between the opposed portions, and the projections respectively extend through throughholes formed in the printed circuit board and soldered to the printed circuit board.

8 Claims, 5 Drawing Sheets

RECEPTACLE

CROSS-REFERENCE TO RELATED APPLICATIONS

This application is related to Japanese application No. 2002-233740 filed on Aug. 9, 2002, whose priority is claimed under 35 USC § 119, the disclosure of which is incorporated by reference in its entirety.

BACKGROUND OF THE INVENTION

1. Field of the Invention

The present invention relates to a receptacle, more particularly, to a receptacle for use in an electronic apparatus such as a DVD player, a TV set, an STB, an AV receiver, a personal computer, a PDA or a cellular phone.

2. Description of the Related Art

Conventionally known receptacles typically comprise a housing having a reception port for receiving an optical signal transmission plug, and a photoelectric converter housed in the housing for transferring and receiving an optical signal to/from the optical signal transmission plug.

Such a receptacle generally has terminals extending from the photoelectric converter out of the housing through through-holes formed in a printed circuit board. The terminals are soldered to the printed circuit board, whereby the receptacle is fixed onto the printed circuit board.

Various receptacle fixing methods and structures have been conceived for more easily and assuredly fixing the receptacle on the printed circuit board.

An exemplary receptacle fixing method hitherto known is such that a receptacle (connector) is temporarily fixed to a printed circuit board by a screw by means of a fixing jig and permanently fixed to the printed circuit board by soldering terminals to the printed circuit board (see, for example, Japanese Unexamined Patent Publication No. 11-167966 (1999)).

An exemplary receptacle fixing structure hitherto known is such that a metal pin projecting upright from a printed circuit board is press-fitted in a hole formed in a fixing portion of a receptacle (connector) and then heated to be fuse-bonded to the fixing portion (see, for example, Japanese Unexamined Patent Publication No. 2000-56186).

In general, the plug is repeatedly connected to and disconnected from the receptacle fixed to the printed circuit board. For the connection and disconnection of the plug, the plug should be inserted into the receptacle exactly in a predetermined insertion direction and withdrawn from the receptacle exactly in a predetermined withdrawal direction. However, the plug is often forcibly inserted into and withdrawn from the receptacle in directions not conforming to the predetermined insertion and withdrawal directions thereby to distort the receptacle.

The forcible insertion and withdrawal of the plug exert stresses on soldered portions of the terminals and, in the worst case, the soldered portions are cracked to cause a connection failure. Therefore, there is a demand for a receptacle fixing structure which exerts no stress on the soldered portions of the terminals even if the plug is forcibly inserted into or withdrawn from the receptacle.

SUMMARY OF THE INVENTION

In view of the foregoing, the present invention is directed to a receptacle which suppresses a stress exerted on a soldered portion of a terminal thereof when a plug is forcibly inserted into or withdrawn from the receptacle.

In accordance with the present invention, there is provided a receptacle which comprises: a housing placed on a printed circuit board and having an insertion hole for receiving an optical signal transmission plug; a photoelectric converter housed in the housing for transferring an optical signal with respect to the received optical signal transmission plug; and an elongate metal member covering the housing for fixing the housing onto the printed circuit board; the housing having a positioning recess formed in a peripheral surface portion thereof not opposed to the printed circuit board as having a shape complementary to that of the elongate member, and a flange overhanging the positioning recess; wherein the elongate member is fixedly fitted in the positioning recess in engagement with the flange; wherein the elongate member has projections respectively projecting from opposed portions thereof with the housing held between the opposed portions, and the projections respectively extend through through-holes formed in the printed circuit board and soldered to the printed circuit board.

That is, the inventive receptacle includes the elongate member covering the housing for fixing the housing onto the printed circuit board, and the elongate member is fixedly fitted in the positioning recess having the shape complementary to that of the elongate member in engagement with the flange.

Therefore, the elongate member is assuredly fixed to the housing with respect to a plug insertion direction and a direction perpendicular to the insertion direction. Even if a plug is forcibly inserted into or withdrawn from the receptacle, the elongate member is less likely to be disengaged from the housing. Hence, the housing is firmly fixed onto the printed circuit board.

As a result, stresses exerted on soldered portions of terminals of the receptacle are minimized.

DESCRIPTION OF THE PREFERRED EMBODIMENTS

Figure 1:
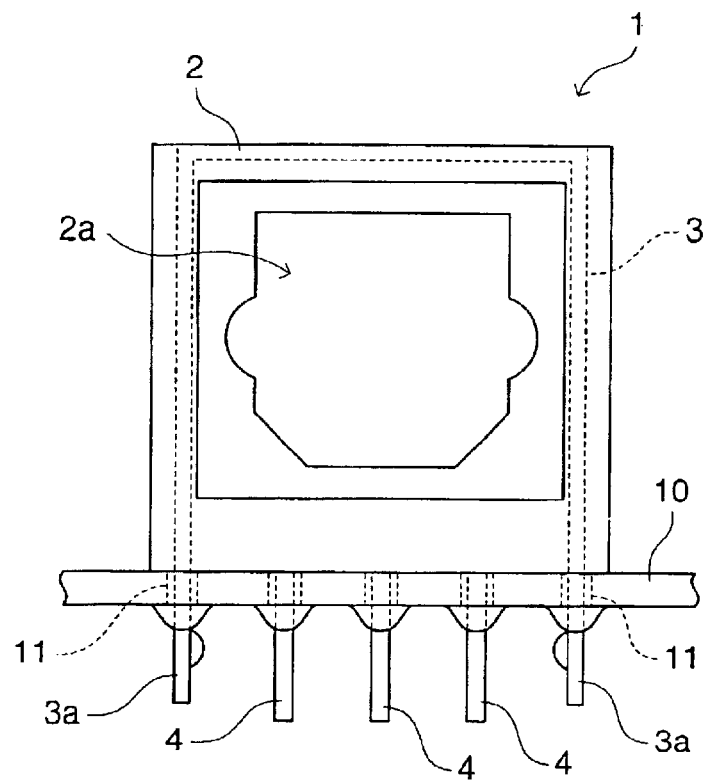
FIG. 1 is a front view of a receptacle according to a first embodiment of the present invention.

A receptacle according to the present invention comprises: a housing placed on a printed circuit board and having an insertion hole for receiving an optical signal transmission plug; a photoelectric converter housed in the housing for transferring and receiving an optical signal to/from the received optical signal transmission plug; and an elongate metal member covering the housing for fixing the housing onto the printed circuit board; the housing having a positioning recess formed in a peripheral surface portion thereof not opposed to the printed circuit board as having a shape complementary to that of the elongate member, and a flange overhanging the positioning recess; wherein the elongate member is fixedly fitted in the positioning recess in engagement with the flange; wherein the elongate member has projections respectively projecting from opposed portions thereof with the housing held between the opposed portions, and the projections respectively extend through through-holes formed in the printed circuit board and soldered to the printed circuit board.

In the inventive receptacle, the optical signal transmission plug has the same configuration as optical signal transmission plugs commonly used for general electronic apparatuses. The housing is composed of a resin, and has a cubic or cuboidal external shape. The photoelectric converter housed in the housing is adapted to convert an optical signal inputted from the plug into an electrical signal and output the electrical signal. Alternatively, the photoelectric converter is adapted to convert an electrical signal inputted from a circuit of the printed circuit board into an optical signal and output the optical signal.

The elongate metal member comprises a plate of aluminum, iron or copper, which is curved or bent in conformity with the external shape of the housing. Where the housing has a cubic or cuboidal shape, for example, the elongate member has an open square shape as seen in section.

The positioning recess of the housing has a shape complementary to the external shape of the elongate member for positioning the elongate member with respect to the housing in engagement with the elongate member. The flange overhangs the positioning recess to at least partly cover the positioning recess. The position and overhanging extent of the flange are properly determined so as to facilitate the engagement of the elongate member and prevent the disengagement of the elongate member from the flange. For example, the flange may project from one side edge of the positioning recess as covering a part of the positioning recess.

In the inventive receptacle, the elongate member may have through-holes respectively formed in the vicinity of the projections for preventing a solder from climbing along the elongate member. With this arrangement, the solder climbing along the elongate member can be trapped in the through-holes for preventing the solder from further climbing ahead of the through-holes when the projections are soldered to the printed circuit board. As a result, the reliability of the receptacle can be improved when the receptacle is mounted on the printed circuit board.

In the inventive receptacle, the projections may respectively project from opposite ends of the elongate member longitudinally of the elongate member. Alternatively, the projections may respectively project from side edge portions of the elongate member perpendicularly to the length of the elongate member.

That is, a face of the housing to be fitted on the printed circuit board (to be opposed to the printed circuit board) can be changed without changing the engagement relationship between the housing and the elongate member by properly changing the projecting direction of the projections.

In accordance with another aspect of the present invention, there is provided an electronic apparatus comprising the aforesaid inventive receptacle.

Next, receptacles according to embodiments of the present invention will be described in detail with reference to the attached drawings. In the following embodiments, like components are denoted by like reference characters.

First Embodiment

Figure 2:
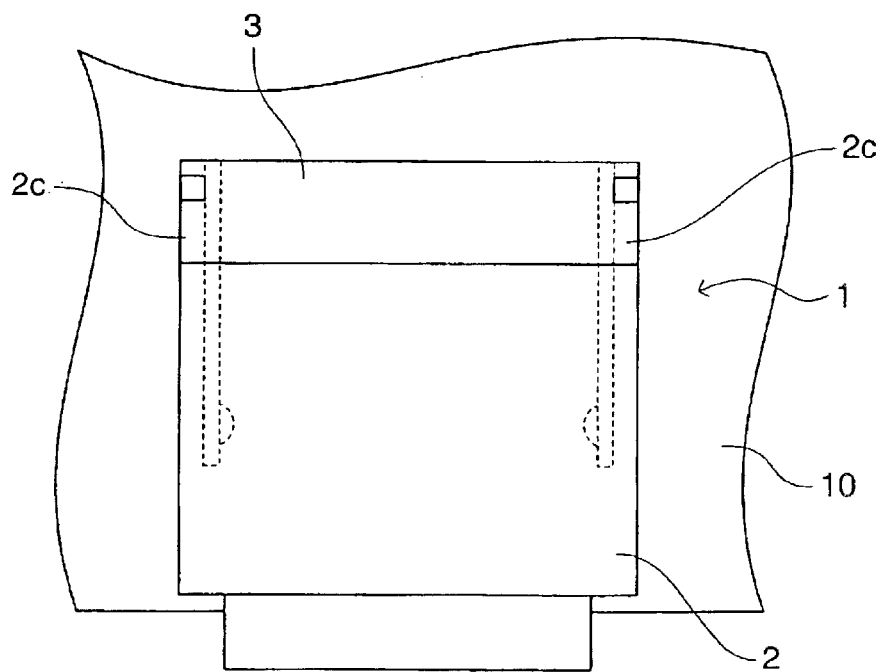
FIG. 2 is a plan view of the receptacle shown in FIG. 1.
Figure 3:
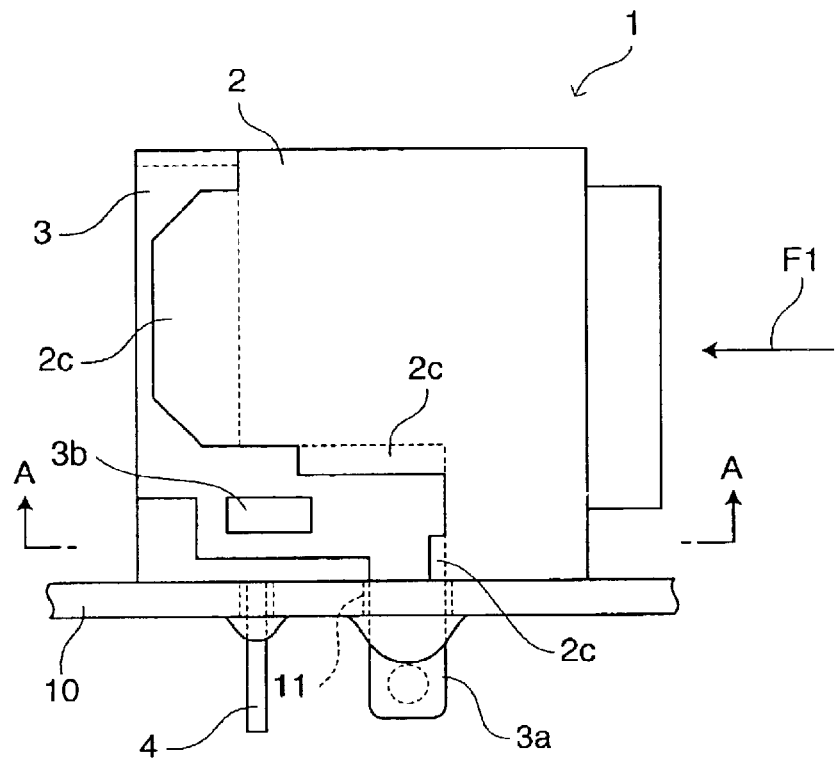
FIG. 3 is a left side view of the receptacle shown in FIG. 1.
Figure 4:
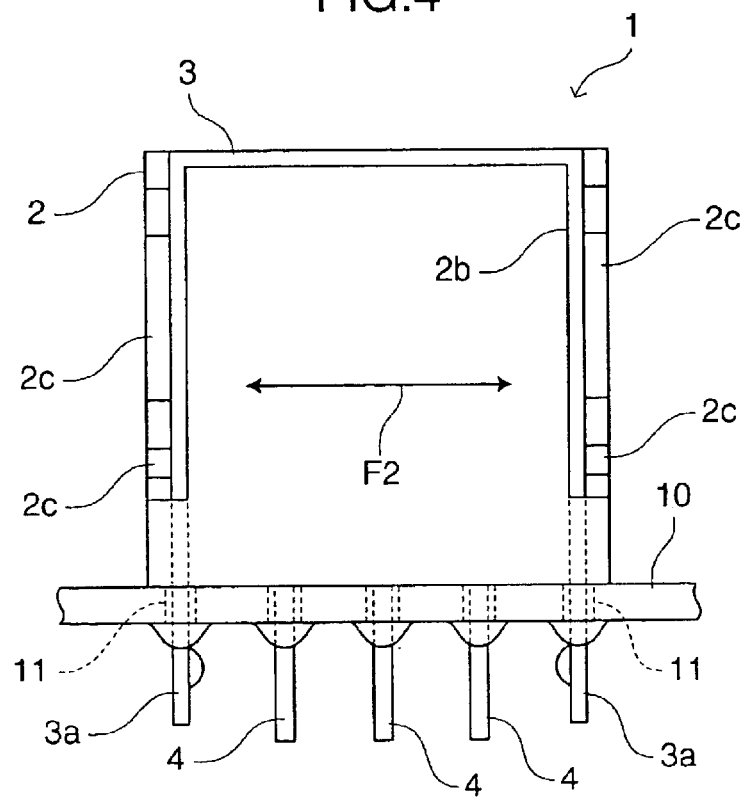
FIG. 4 is a rear view of the receptacle shown in FIG. 1.
Figure 5:
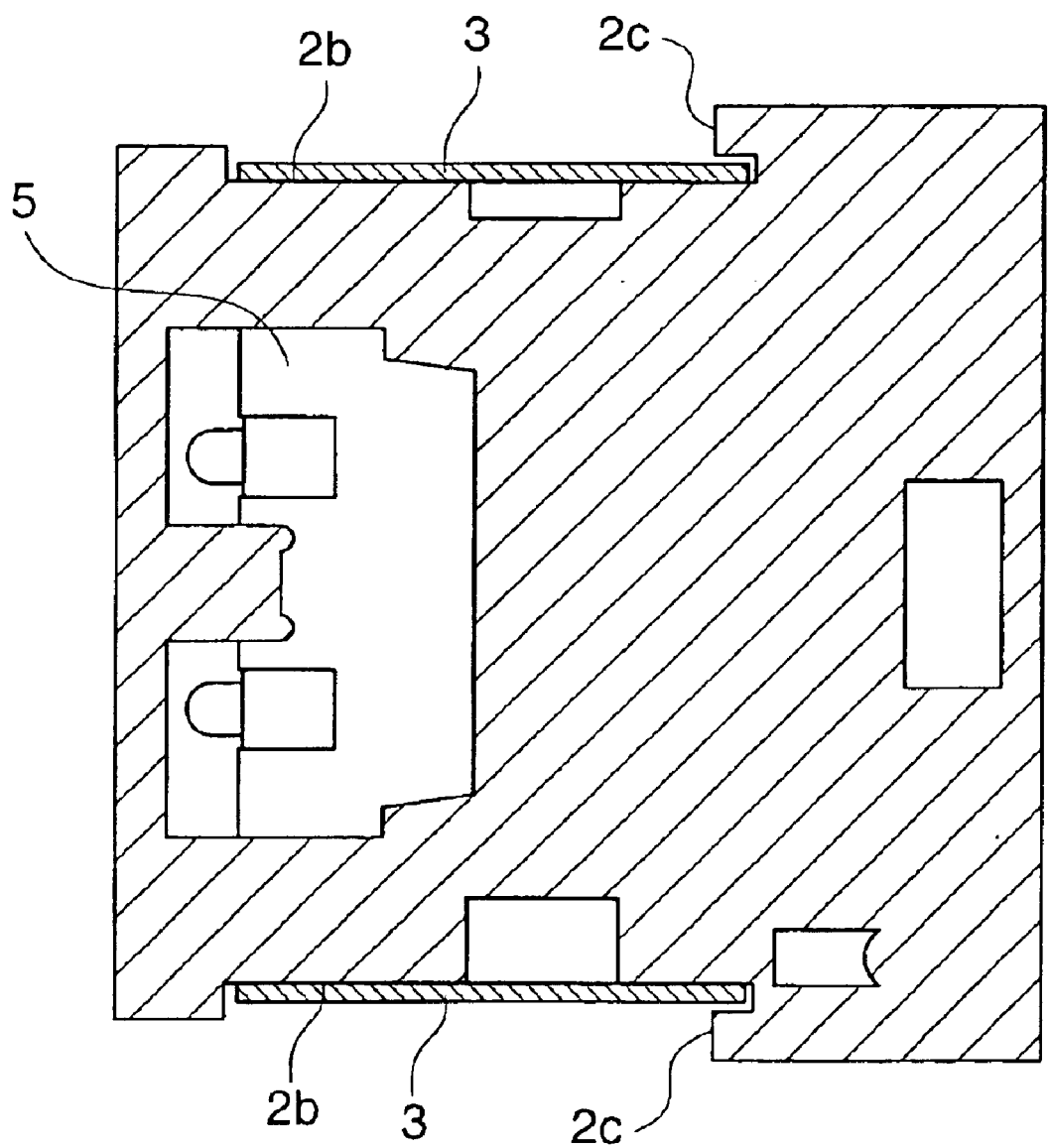
FIG. 5 is a sectional view taken along a line A—A in FIG. 3.
Figure 6:
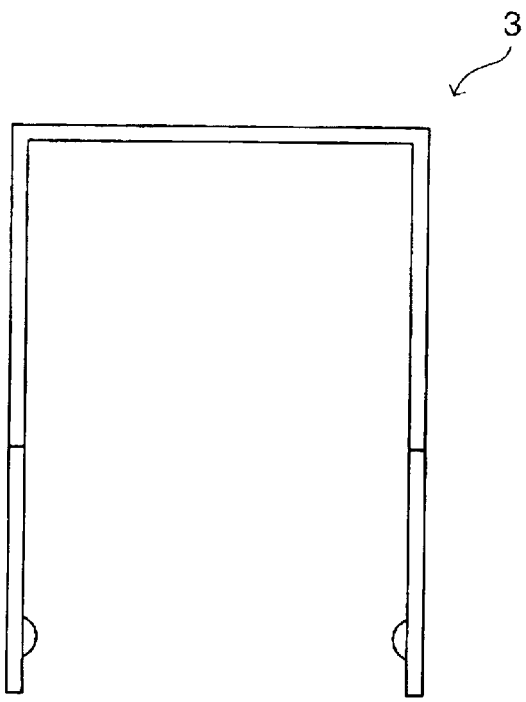
FIG. 6 is a front view of an elongate member used in the receptacle according to the first embodiment of the invention.

FIG. 1 is a front view of a receptacle according to a first embodiment of the present invention. FIGS. 2, 3 and 4 are a plan view, a left side view and a rear view, respectively, of the receptacle shown in FIG. 1. FIG. 5 is a sectional view taken along a line A—A in FIG. 3. FIG. 6 is a front view of an elongate member employed in the receptacle according to the first embodiment, and FIG. 7 is a left side view of the elongate member shown in FIG. 6.

As shown in FIGS. 1 to 5, the receptacle 1 according to the first embodiment includes a housing 2 placed on a printed circuit board 10 and having an insertion hole 2a for receiving an optical signal transmission plug (not shown), a photoelectric converter 5 housed in the housing 2 for transferring an optical signal with respect to the received optical signal transmission plug, and an elongate metal member 3 covering the housing 2 for fixing the housing 2 onto the printed circuit board 10. The housing 2 has a positioning recess 2b formed in a peripheral surface portion thereof not opposed to the printed circuit board 10 as having a shape complementary to that of the elongate member 3, and flanges 2c overhanging the positioning recess 2b. The elongate member 3 is fixedly fitted in the positioning recess 2b in engagement with the flanges 2c. The elongate member 3 has projections 3a respectively projecting from opposed portions thereof with the housing 2 held between the opposed portions. The projections 3a respectively extend through through-holes 11 formed in the printed circuit board 10 and soldered to the printed circuit board 10.

As shown in FIGS. 1 and 4, three terminals 4 extending from the photoelectric converter 5 project from a face of the housing 2 to be fitted on the printed circuit board 10, and soldered to a circuit of the printed circuit board 10. As shown in FIG. 3, the elongate member 3 has through-holes 3b formed in the vicinity of the projections 3a. Thus, a melted solder climbing along the projections 3a can be trapped in the through-holes 3b so as to be prevented from further climbing along the elongate member when the receptacle is soldered to the printed circuit board. The projections 3a respectively project from opposite ends of the elongate member 3 longitudinally of the elongate member 3.

Figure 7:
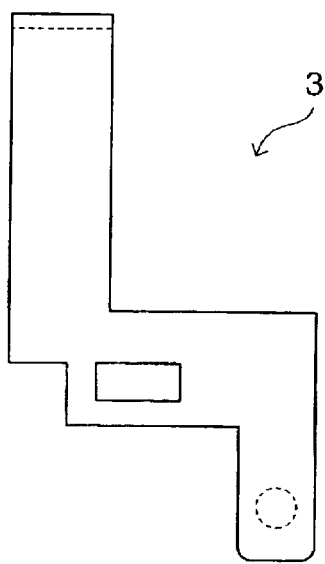
FIG. 7 is a left side view of the elongate member shown in FIG. 6.

The elongate member 3 per se has a shape as shown in FIGS. 6 and 7. The elongate member 3 is fixedly fitted in the positioning recess 2b of the housing 2 in engagement with the flanges 2c as shown in FIGS. 2 to 5.

Therefore, the elongate member 3 is assuredly fixed to the housing 2 with respect to both a plug insertion direction F1 (see FIG. 3) in which the optical signal transmission plug is inserted in to the housing 2 and a direction F2 perpendicular to the insertion direction (see FIG. 4).

As a result, the housing 2 is firmly fixed to the printed circuit board 10 by the elongate member 3. Therefore, no excessive stress is exerted on soldered portions of the terminals 4 when the optical signal transmission plug is forcibly inserted into or withdrawn from the receptacle.

Second Embodiment

Figure 8:
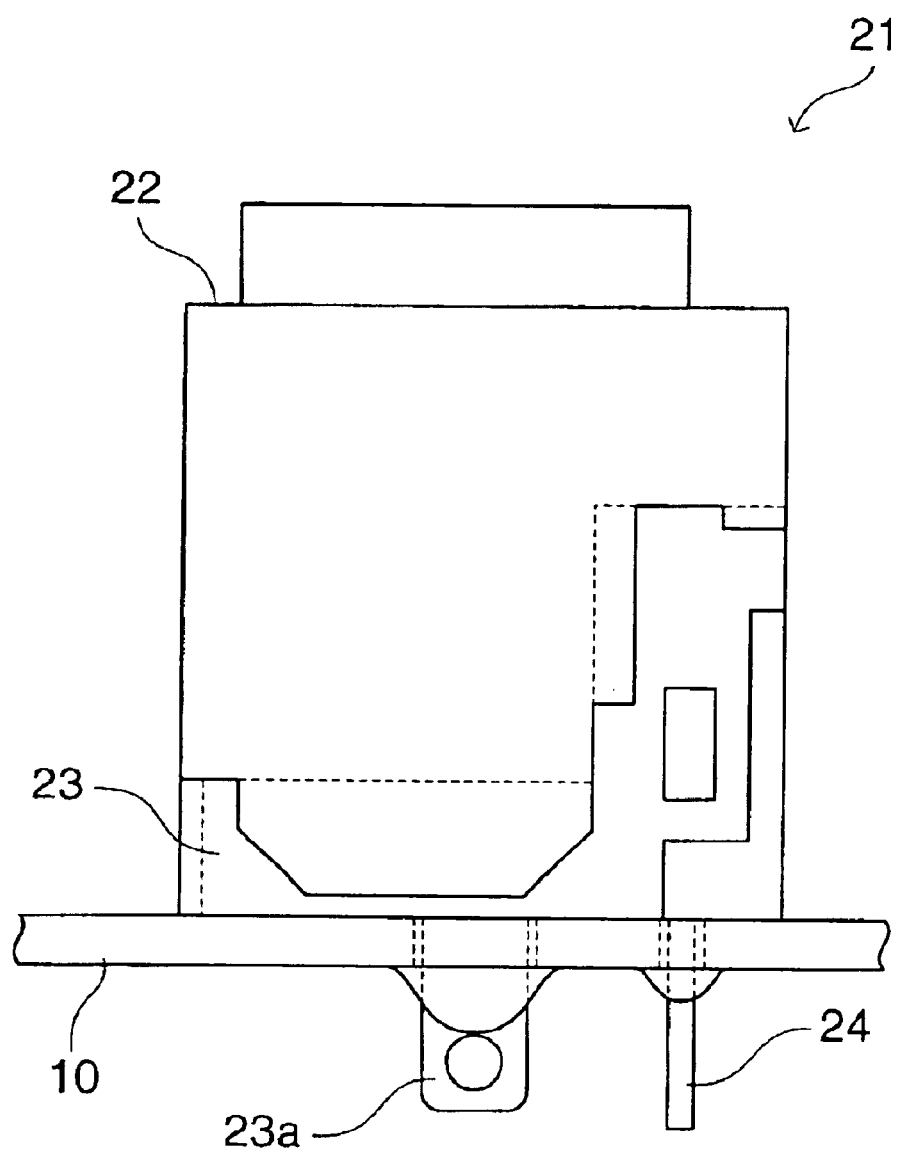
FIG. 8 is a front view of a receptacle according to a second embodiment of the present invention.

FIG. 8 is a front view of a receptacle according to a second embodiment of the present invention.

As shown in FIG. 8, the receptacle 21 according to the second embodiment has substantially the same construction as the receptacle 1 of the first embodiment, except that the positions and projecting directions of projections and terminals of the receptacle 21 are different from the positions and projecting directions of the projections 3a and terminals 4 of the receptacle 1.

In the receptacle 21 according to the second embodiment, an elongate member 23 has projections 23a projecting from side edge portions thereof perpendicularly to the length of the elongate member 23. Terminals 24 of the receptacle 21 project in the same directions as the projections 23a.

That is, the face of the housing to be fitted on the printed circuit board 10 (to be opposed to the printed circuit board 10) can be changed from that according to the first embodiment without changing the engagement relationship between the housing 2 (22) and the elongate member 3 (23) by changing the positions and projecting directions of the projections 3a (23a) and the terminals 4 (24).

According to the present invention, the receptacle includes the elongate member covering the housing for fixing the housing onto the printed circuit board. The elongate member is fixedly fitted in the positioning recess having a shape complementary to that of the elongate member in engagement with the flange. Thus, the elongate member is assuredly fixed to the housing with respect to both the plug insertion direction and the direction perpendicular to the insertion direction, and is less liable to be disengaged from the housing even if the plug is forcibly inserted into or withdrawn from the housing. Therefore, the housing is firmly fixed to the printed circuit board. As a result, the stresses exerted on the soldered portions of the terminals are reduced.

What is claimed is:

1. A receptacle comprising:
   a housing placed on a printed circuit board and having an insertion hole for receiving an optical signal transmission plug;
   a photoelectric converter housed in the housing for transferring and receiving an optical signal to/from the received optical signal transmission plug; and
   an elongate metal member covering the housing for fixing the housing onto the printed circuit board;
   the housing having a positioning recess formed in a peripheral surface portion thereof not opposed to the printed circuit board as having a shape complementary to that of the elongate member, and a flange overhanging the positioning recess;
   wherein the elongate member is fixedly fitted in the positioning recess in engagement with the flange;
   wherein the elongate member has projections respectively projecting from opposed portions thereof with the housing held between the opposed portions, and the projections respectively extend through through-holes formed in the printed circuit board and soldered to the printed circuit board.

2. A receptacle as set forth in claim 1, wherein the elongate member has through-holes respectively formed in the vicinity of the projections for preventing a solder from climbing along the elongate member.

3. A receptacle as set forth in claim 1, wherein the projections respectively project from opposite ends of the elongate member longitudinally of the elongate member.

4. A receptacle as set forth in claim 1, wherein the projections respectively project from side edge portions of the elongate member perpendicularly to the length of the elongate member.

5. An electronic apparatus comprising a receptacle as recited in claim 1.

6. A receptacle as set forth in claim 1, wherein the housing is composed of a resin, and has a substantially cuboidal external shape.

7. A receptacle as set forth in claim 1, wherein the opposed portions of the elongate member holding the housing therebetween are each bent in a crank-like shape.

8. A receptacle as set forth in claim 1, wherein the flange projects from one side edge of the positioning recess to partly overhang the positioning recess.

* * * * *